United States Patent
Maekawa et al.

(10) Patent No.: US 10,784,392 B2
(45) Date of Patent: Sep. 22, 2020

(54) SOLAR CELL MODULE AND METHOD FOR MANUFACTURING THE SAME

(71) Applicant: PANASONIC INTELLECTUAL PROPERTY MANAGEMENT CO., LTD., Osaka (JP)

(72) Inventors: Akimichi Maekawa, Osaka (JP); Youhei Murakami, Osaka (JP); Haruhisa Hashimoto, Osaka (JP); Junpei Irikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/358,439

(22) Filed: Mar. 19, 2019

(65) Prior Publication Data

US 2019/0214517 A1 Jul. 11, 2019

Related U.S. Application Data

(63) Continuation of application No. PCT/JP2017/033191, filed on Sep. 14, 2017.

(30) Foreign Application Priority Data

Sep. 28, 2016 (JP) .................................. 2016-190384

(51) Int. Cl.
*H01L 31/056* (2014.01)
*H01L 31/049* (2014.01)
(Continued)

(52) U.S. Cl.
CPC .......... *H01L 31/056* (2014.12); *C08L 101/12* (2013.01); *H01L 31/028* (2013.01);
(Continued)

(58) Field of Classification Search
CPC ... H01L 31/056; H01L 31/049; H01L 31/054; H01L 31/0547; H01L 31/048;
(Continued)

(56) References Cited

U.S. PATENT DOCUMENTS

| 5,660,645 A | 8/1997 | Mori et al. |
| 2007/0179224 A1* | 8/2007 | Fanayar ............... C08K 5/0008 |
| | | 524/100 |

(Continued)

FOREIGN PATENT DOCUMENTS

| JP | 08-018086 A | 1/1996 |
| JP | 2012-209514 A | 10/2012 |

(Continued)

OTHER PUBLICATIONS

International Search Report and Written Opinion dated Nov. 7, 2017 in International (PCT) Application No. PCT/JP2017/033191; with partial English translation.

*Primary Examiner* — Susan D Leong
(74) *Attorney, Agent, or Firm* — McDermott Will & Emery LLP

(57) ABSTRACT

A solar cell module includes: a solar cell having a front surface and a back surface; a front surface side encapsulant disposed on a front surface side of the solar cell, the front surface side encapsulant including a transparent resin sheet; a light reflector protruding from an end portion of the solar cell, the light reflector including a light reflection layer that reflects incident light, and a substrate layer that is disposed on the light reflection layer on a light incident side; and an ultraviolet absorber disposed closer to the light incident side than the light reflection layer, the light incident side being a back surface side of the front surface side encapsulant.

14 Claims, 5 Drawing Sheets

(51) Int. Cl.
- *H01L 31/048* (2014.01)
- *H01L 31/0224* (2006.01)
- *H01L 31/054* (2014.01)
- *H01L 31/18* (2006.01)
- *H01L 31/028* (2006.01)
- *H01L 31/05* (2014.01)
- *C08L 101/12* (2006.01)

(52) U.S. Cl.
CPC .... *H01L 31/022425* (2013.01); *H01L 31/048* (2013.01); *H01L 31/049* (2014.12); *H01L 31/0481* (2013.01); *H01L 31/0488* (2013.01); *H01L 31/054* (2014.12); *H01L 31/0504* (2013.01); *H01L 31/0547* (2014.12); *H01L 31/1804* (2013.01); *Y02E 10/52* (2013.01)

(58) Field of Classification Search
CPC ............. H01L 31/0481; H01L 31/0488; H01L 31/0504; H01L 31/0465; H01L 31/0512; H01L 31/0508; H01L 31/0516; Y02E 10/52

See application file for complete search history.

(56) References Cited

U.S. PATENT DOCUMENTS

| | | | |
|---|---|---|---|
| 2013/0037085 A1* | 2/2013 | Werner | H01L 31/055 136/249 |
| 2013/0340804 A1* | 12/2013 | Moon | H01L 31/0516 136/244 |
| 2015/0007884 A1* | 1/2015 | Kalkanoglu | B32B 17/10788 136/256 |
| 2015/0369974 A1* | 12/2015 | Tominaga | G02B 5/085 359/360 |
| 2016/0268466 A1 | 9/2016 | Ogawa et al. | |
| 2018/0013025 A1 | 1/2018 | Iwata et al. | |

FOREIGN PATENT DOCUMENTS

| | | |
|---|---|---|
| JP | 2013-065708 A | 4/2013 |
| JP | 2013-098496 A | 5/2013 |
| JP | 2014-007384 A | 1/2014 |
| JP | 2016-171299 A | 9/2016 |
| WO | 2016/157684 A1 | 10/2016 |

* cited by examiner

SOLAR CELL MODULE AND METHOD FOR MANUFACTURING THE SAME

CROSS REFERENCE TO RELATED APPLICATIONS

This application is a U.S. continuation application of PCT International Patent Application Number PCT/JP2017/033191 filed on Sep. 14, 2017, claiming the benefit of priority of Japanese Patent Application Number 2016-190384 filed on Sep. 28, 2016, the entire contents of which are hereby incorporated by reference.

BACKGROUND

1. Technical Field

The present disclosure relates to a solar cell module and a method for manufacturing the same.

2. Description of the Related Art

Conventionally, a solar cell module includes reflectors disposed on the light-receiving surface sides of solar cells (for example, Patent Literature (PTL) 1 (Japanese Unexamined Patent Application Publication No. 2013-98496)).

In this solar cell module, in order to effectively use sunlight emitted to spaces between solar cells, light reflectors protruding from the light-receiving surfaces of the solar cells and inclined relative to the light-receiving surfaces are provided in the spaces between the solar cells.

SUMMARY

In a solar cell module, since ultraviolet light can also contribute to power generation, solar cells are sealed with resin having as high a light transmittance as possible. Unfortunately, a substrate layer provided between a light reflection layer and a solar cell has been relatively more sensitive to ultraviolet light than other components, has cracked due to yellowing and strength reduction when exposed to light for a long time, and has caused the poor appearance of the solar cell module.

In view of this, the present disclosure has an object to provide a solar cell module and a method for manufacturing the same that can prevent poor appearance due to yellowing of a substrate layer, and reduce cracking of the substrate layer due to aged deterioration.

In order to achieve the above object, a solar cell module according to one aspect of the present disclosure includes: a solar cell having a front surface and a back surface; a front surface side encapsulant disposed on a front surface side of the solar cell, the front surface side encapsulant including a transparent resin sheet; a light reflector protruding from an end portion of the solar cell, the light reflector including a light reflection layer that reflects incident light, and a substrate layer that is disposed on the light reflection layer on a light incident side; and an ultraviolet absorber disposed closer to the light incident side than the light reflection layer, the light incident side being a back surface side of the front surface side encapsulant.

Moreover, in order to achieve the above object, a method for manufacturing a solar cell module according to one aspect of the present disclosure includes: disposing a light reflector that protrudes from an end portion of a solar cell, the light reflector including a light reflection layer that reflects incident light, and a substrate layer that is disposed on the light reflection layer on a light incident side; and disposing an ultraviolet absorber closer to the light incident side than the light reflection layer.

The present disclosure makes it possible to prevent poor appearance due to yellowing of a substrate layer, and reduce cracking of the substrate layer due to aged deterioration.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENT

Hereinafter, an embodiment of the present disclosure will be described with reference to the drawings. The embodiment described below represents a specific example of the present disclosure. Accordingly, the numerical values, shapes, materials, structural components, the arrangement and connection of the structural components, steps, the order of the steps, etc. shown in the following embodiment are mere examples, and are not intended to limit the scope of the present disclosure.

Therefore, among the structural components in the following embodiment, structural components not recited in any one of the independent claims that indicate the broadest concepts of the present disclosure are described as optional structural components.

Moreover, the expression "approximately XX," for example, "approximately the same," is intended to include not only exactly the same but also something that can be substantially recognized as the same.

It should be noted that the figures are schematic diagrams and are not necessarily precise illustrations. Furthermore, in the figures, substantially identical components are assigned the same reference signs, and overlapping description thereof may be omitted or simplified.

Embodiment

[Configuration of Solar Cell Module]

Figure 1:
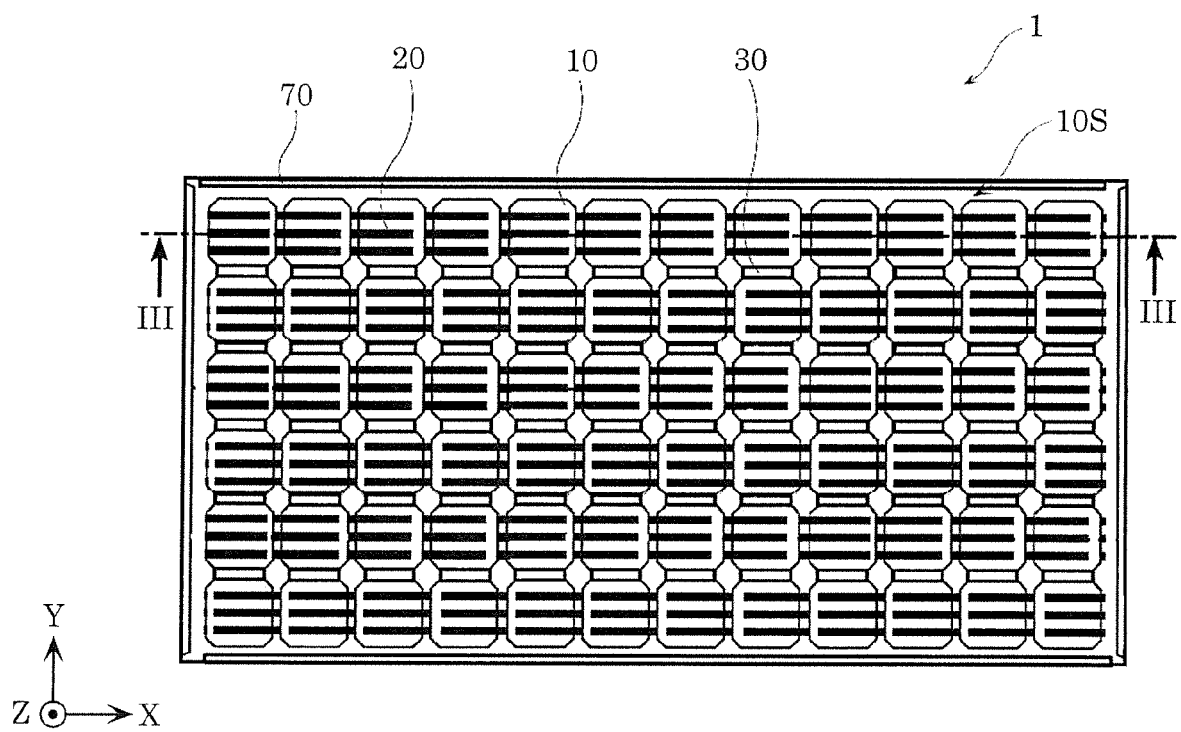
FIG. 1 is a plan view of a solar cell module according to an embodiment.
Figure 2:
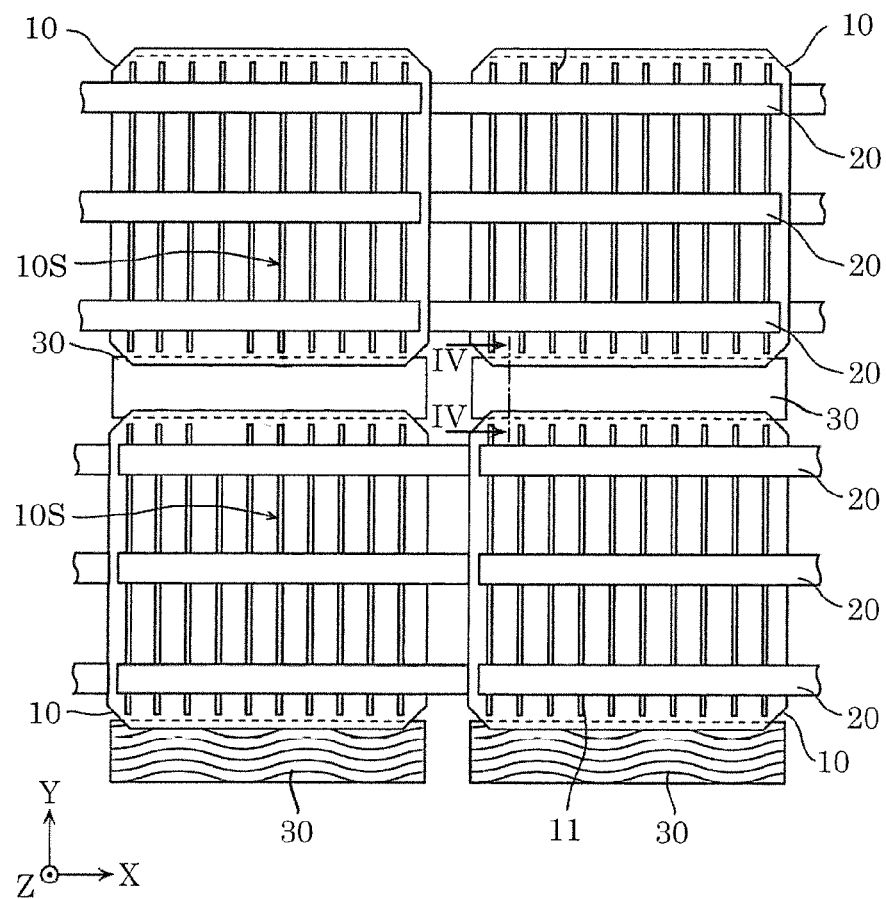
FIG. 2 is a partially enlarged plan view of the solar cell module according to the embodiment when viewed from a front surface side.
Figure 3:
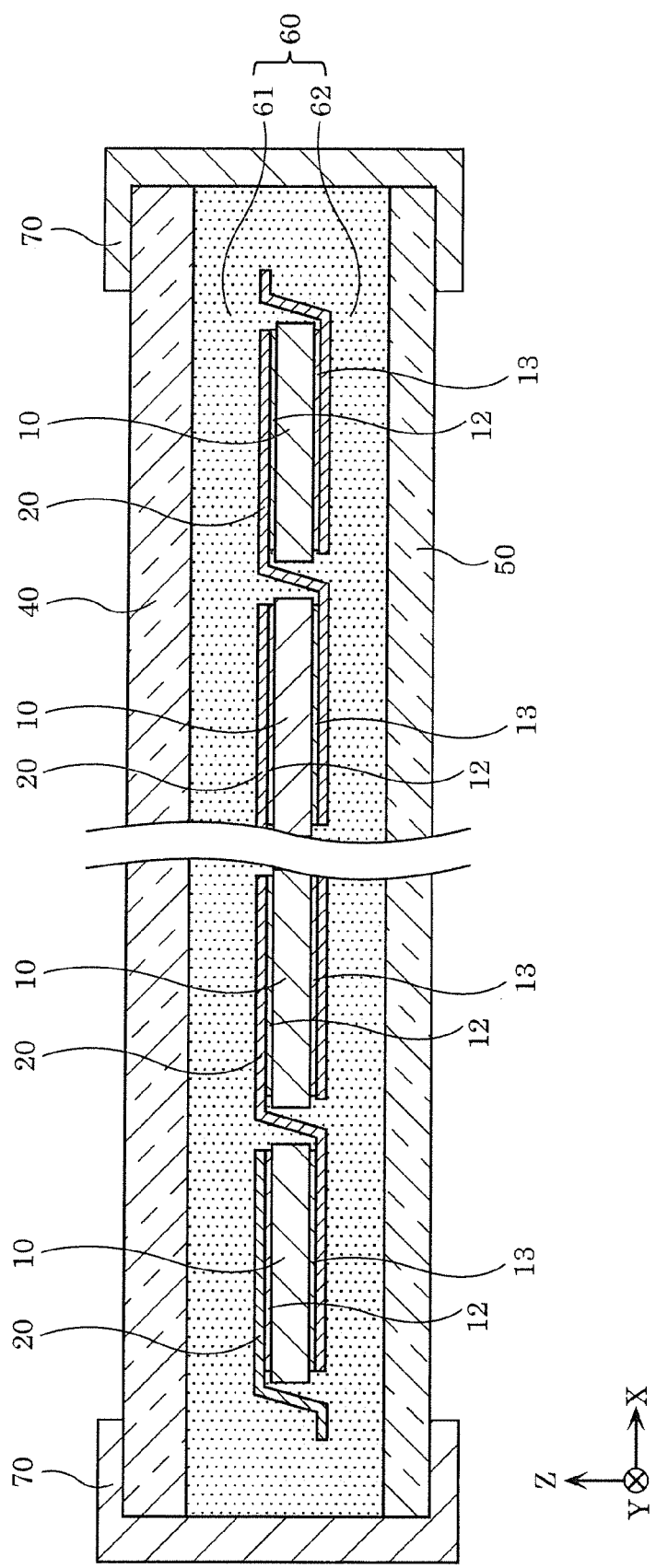
FIG. 3 is a cross-sectional view of the solar cell module according to the embodiment, taken along III-III line in FIG. 1.
Figure 4:
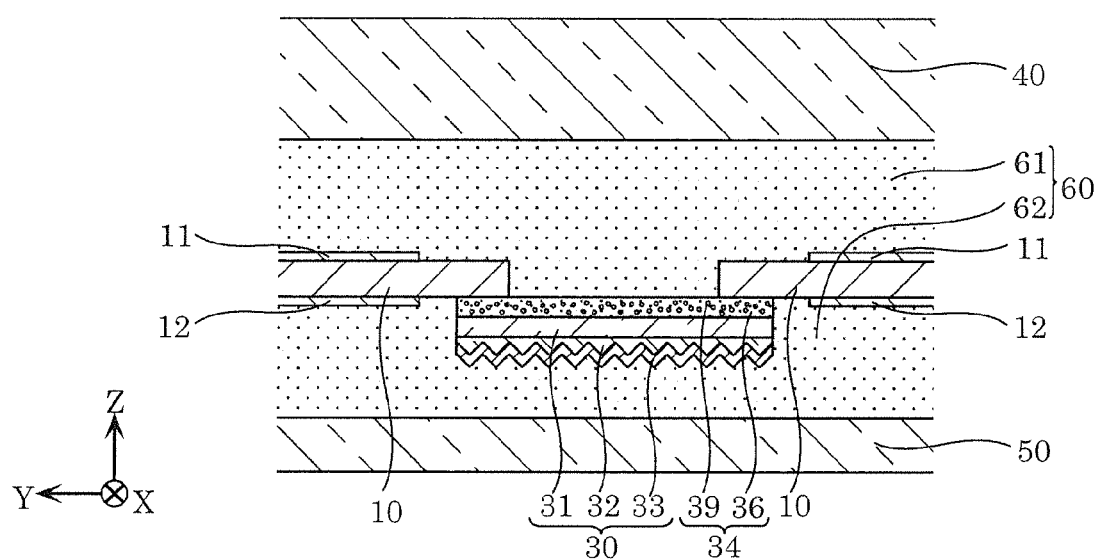
FIG. 4 is a partially enlarged cross-sectional view of the solar cell module according to the embodiment, taken along IV-IV line in FIG. 2.

First, a schematic configuration of solar cell module 1 according to the present embodiment will be described with reference to FIGS. 1 to 4. FIG. 1 is a plan view of solar cell module 1 according to the present embodiment. FIG. 2 is a partially enlarged plan view of solar cell module 1 according to the present embodiment when viewed from a front surface side. FIG. 3 is a cross-sectional view of solar cell module 1 according to the present embodiment, taken along III-III line in FIG. 1. FIG. 4 is a partially enlarged cross-sectional view of solar cell module 1 according to the present embodiment, taken along IV-IV line in FIG. 2.

In FIG. 1, the direction in which twelve solar cells 10 arranged at regular intervals along a row direction are aligned is defined as the X-axis direction. The direction in which six solar cell strings 10S are aligned so that two adjacent solar cell strings 10S are parallel in a column direction is defined as the Y-axis direction. Further, the up-down direction is defined as the Z-axis direction. It should be noted that in FIG. 1, the X-axis direction, the Y-axis direction, and the Z-axis direction may change depending on the application, and thus are not limited to the above definitions. The same applies to figures subsequent to FIG. 1.

A "front surface" of solar cell module 1 denotes a surface through which light on a "front surface" side of a solar cell can enter, and a "back surface" of solar cell module 1 denotes a surface opposite the front surface of solar cell module 1. In addition, the "front surface" of solar cell module 1 is an upper side (X-axis positive direction), and the "back surface" of solar cell module 1 is a downside (X-axis negative direction).

As shown in FIG. 1 to FIG. 3, solar cell module 1 includes solar cells 10, line 20, light reflector 30, front surface protector 40, back surface protector 50, encapsulant 60, and frame 70. Solar cell module 1 has a structure in which solar cells 10 are sealed by encapsulant 60 between front surface protector 40 and back surface protector 50.

As shown in FIG. 1, solar cell module 1 has, for example, an approximately rectangular shape in a plan view. As an example, solar cell module 1 has an approximately rectangular shape that is about 1600 mm wide and about 800 mm long. It should be noted that the shape of solar cell module 1 is not limited to the shape in which six solar cell strings 10S each including twelve solar cells 10 are arranged, and is not limited to a rectangle.

[Solar Cell]

Solar cell 10 is a photoelectric conversion element (a photovoltaic element) that converts light, such as sunlight, into electric power. Solar cells 10 are arranged in rows and columns (a matrix) in the same plane.

Two adjacent solar cells 10 among solar cells 10 linearly arranged are connected by lines 20 to form a string. Solar cells 10 are electrically connected by lines 20 to form a string. Solar cells 10 in one solar cell string 10S are connected in series by lines 20.

In the present embodiment, twelve solar cells 10 arranged at regular intervals along the row direction (the X-axis direction) are connected by lines 20 to form one solar cell string 10S. More specifically, each solar cell string 10S is formed by sequentially connecting two solar cells 10 adjacent in the row direction (the X-axis direction) by three lines 20, thereby connecting all solar cells 10 arranged in a line along the row direction.

Solar cell strings 10S are formed. Solar cell strings 10S are arranged along the column direction (the Y-axis direction). In the present embodiment, six solar cell strings 10S are arranged at regular intervals along the column direction so as to be parallel to one another.

It should be noted that the first solar cell 10 in each solar cell string 10S is connected to a connection line via line 20 on both end sides in the row direction. Moreover, the last solar cell 10 in each solar cell string 10S is connected to the connection line via line 20. Accordingly, solar cell strings 10S (six in FIG. 1) are connected in series or parallel to form a cell array. In the present embodiment, six adjacent solar cell strings 10S are connected in series to form a series connection body (a series connection body including twenty four solar cells 10 connected in series), and three series connection bodies are connected in parallel.

As shown in FIG. 1 and FIG. 2, solar cells 10 are disposed so that solar cells 10 adjacent in the row direction and the column direction have spaces therebetween. As will be described later, light reflectors 30 extend across the spaces.

In the present embodiment, solar cell 10 has an approximately rectangular shape in a plan view. Specifically, solar cell 10 has a shape of a 125-mm square having chamfered corners, and an approximately octagonal shape having linear long sides and linear or non-linear short sides alternatively connected. In other words, one solar cell string 10S is configured so that one side of one of two adjacent solar cells 10 faces one side of the other of two adjacent solar cells 10. It should be noted that solar cell 10 is not limited to the approximately rectangular shape.

The basic structure of solar cell 100 is a semiconductor pn-junction, and as an example, solar cell 10 includes an n-type single-crystal silicon substrate that is an n-type semiconductor substrate, an n-type amorphous silicon layer and an n-side electrode that are sequentially disposed on a principal surface side of the n-type single-crystal silicon substrate, and a p-type amorphous silicon layer and a p-side electrode that are sequentially disposed on the other principal surface of the n-type single-crystal silicon substrate. A passivation layer, such as an i-type amorphous silicon layer or a silicon oxide layer, may be provided between the n-type single-crystal silicon substrate and the n-type amorphous silicon layer or the n-type single-crystal silicon substrate and the p-type amorphous silicon layer to reduce recombination of generated charge carriers. The n-side electrode and the p-side electrode are, for example, transparent electrodes including ITO (Indium Tin Oxide) etc.

It should be noted that in the present embodiment, solar cell 10 is disposed so that the n-side electrode is on a principal light receiving surface side (front surface protector 40 side in FIG. 3) of solar cell module 1, but the present embodiment is not limited to this. Moreover, when solar cell module 1 is a monofacial module, an electrode on the back surface side (the p-side electrode in the present embodiment) need not be transparent, and may be, for example, a reflective metal electrode.

As shown in FIG. 3, in each solar cell 10, a front surface is a surface on the front surface protector 40 side, and a back surface is a surface on the back surface protector 50 side. Front side collector electrode 11 and back side collector electrode 12 are disposed on solar cell 10. Front side collector electrode 11 is electrically connected to a front side electrode (e.g. the n-side electrode) of solar cell 10. Back side collector electrode 12 is electrically connected to a back side electrode (e.g. the p-side electrode) of solar cell 10.

Front side collector electrode 11 and back side collector electrode 12 are each constituted by, for example, finger electrodes formed linearly and orthogonally to the direction in which lines 20 extend, and bus bar electrodes connected with the finger electrodes and formed linearly in the direction orthogonal to the finger electrodes (the direction in which lines 20 extend). The number of bus bar electrodes is the same as, for example, the number of lines 20, and is three in the present embodiment. It should be noted that front side collector electrode 11 and back side collector electrode 12 have the same shape, but the present embodiment is not limited to this.

Front side collector electrode 11 and back side collector electrode 12 include a conductive material having low resistance, such as silver (Ag). For example, front side collector electrode 11 and back side collector electrode 12 can be formed by screen printing a conductive paste (e.g. silver paste) obtained by dispersing conductive filler such as silver in a binder resin, in a predetermined pattern.

In such solar cell 10, both the front surface and the back surface serve as light-receiving surfaces. When light is incident on solar cell 10, charge carriers are generated in a photoelectric converter of solar cell 10. The generated charge carriers are collected by front side collector electrode 11 and back side collector electrode 12, and flow to lines 20. As described above, the charge carriers generated in solar cell 10 can be efficiently taken out to an external circuit by providing front side collector electrode 11 and back side collector electrode 12.

[Connection Line]

Line 20 (interconnector) electrically connects two adjacent solar cells 10 in solar cell string 10S. In the present embodiment, two adjacent solar cells 10 are electrically connected by three lines 20 disposed approximately parallel to each other. Each line 20 extends along the X-axis direction relative to two solar cells 10 arranged in the X-axis direction.

Lines 20 are elongated conductive lines, and are, for example, ribbon-shaped metal foil or thin metal wires. Lines 20 can be produced by cutting, for example, metal foil, such as copper foil or silver foil having surfaces entirely covered with solder, silver, etc. into strips having a predetermined length.

One end portion of each line 20 is disposed on the front surface of one of two adjacent solar cells 10, and another end portion of each line 20 is disposed on the back surface of the other of two adjacent solar cells 10.

Each line 20 electrically connects front side collector electrode 11 of one of two adjacent solar cells 10 and back side collector electrode 12 of the other of two adjacent solar cells 10. For example, lines 20 and bus bar electrodes of front side collector electrode 11 and back side collector electrode 12 on solar cell 10 are bonded together with a conductive adhesive such as a resin including solder or conductive particles.

[Light Reflector]

As shown in FIG. 4, light reflection layer 33 is disposed on the back surface side of solar cell 10. Light reflection layer 33 has surfaces both of which are light reflective, and reflects incident light.

Light reflector 30 is disposed in a space between two adjacent solar cells 10. In the present embodiment, light reflector 30 is provided to every two adjacent solar cells 10 so that light reflector 30 extends across the space between two solar cells 10 adjacent in the Y-axis direction. Since each light reflector 30 extends across the space between two adjacent solar cells 10, the width of each light reflector 30 is greater than the width of the space between two adjacent solar cells 10.

Each space between two adjacent solar cells 10 is a space between one side of one of solar cells 10 and one side of the other of solar cells 10 facing the one side. In other words, the space between two adjacent solar cells 10 is long along the row direction and extends in a direction parallel to solar cell string 10S. That is to say, light reflector 30 is disposed on the back surface side of two adjacent solar cells 10 that have the space therebetween and not connected by line 20 so that light reflector 30 extends from one of solar cells 10 to the other of solar cells 10.

In the present embodiment, two light reflectors 30 are provided to every solar cell 10 except outermost solar cells 10 of solar cell strings 10S. Light reflector 30 is a tape-shaped sheet extending in the row direction of solar cell string 10S. As an example, light reflector 30 has an elongated rectangular shape. Light reflector 30 is attached along one side of solar cell 10 so that one end portion of light reflector 30 in the width direction (the Y-axis direction) and an end portion of solar cell 10 overlap. In other words, light reflector 30 is attached approximately in parallel to line 20.

In the present embodiment, light reflector 30 includes substrate layer (base film layer) 31, shaping layer 32, and light reflection layer 33, and these layers are stacked in listed order in the Z-axis negative direction.

Light reflector 30 is bonded to the back surface side of solar cells 10 with bonding layer 34 (an example of an ultraviolet absorbing layer) provided on the back surface side of solar cells 10. The ultraviolet absorbing layer (bonding layer 34 in the present embodiment) including ultraviolet absorber (UVA) 39 is provided between front surface side encapsulant 61 and substrate layer 31. Bonding layer 34 is a transparent adhesive component provided on substrate layer 31 on the solar cell 10 side, between substrate layer 31 and solar cells 10.

Bonding layer 34 is provided closer to the light incident side than light reflection layer 33. In other words, bonding layer 34 is provided on the entire surface of substrate layer 31. Bonding layer 34 covers entire light reflection layer 33 on the solar cell 10 side. Bonding layer 34 includes adhesive 36 and ultraviolet absorber 39 included in adhesive 36. In other words, bonding layer 34 is an ultraviolet absorbing layer that bonds light reflector 30 to end portions of solar cells 10 and includes ultraviolet absorber 39.

For example, adhesive 36 is heat-sensitive adhesive or pressure-sensitive adhesive including ethylene-vinyl acetate (EVA). Accordingly, light reflector 30 can be bonded and secured to solar cells 10 by thermocompression bonding.

As described above, since a material softer than substrate layer 31 is used for bonding layer 34, when light reflector 30 is bonded to solar cell 10 via bonding layer 34, fillets of bonding layer 34 are formed on the back surface and side surface of solar cell 10. As a result, the contact surface area between solar cell 10 and bonding layer 34 can be increased, and thus the adhesion between solar cell 10 and bonding layer 34 improves.

Ultraviolet absorber 39 is a high-molecular-weight ultraviolet absorber having a molecular weight of more than 1000. Ultraviolet absorber 39 is approximately evenly provided in bonding layer 34, and has a property of absorbing ultraviolet rays included in light. Ultraviolet absorber 39 is, for example, an ultraviolet absorber including benzophenone, benzotriazole, triazine, cyanoacrylate, salicylate, acrylonitrile, etc. More specifically, examples of ultraviolet absorber 39 include 2,2'-Methylenebis [(6-(2H-benzotriazol-2-yl)-4-(1,1,3,3-tetramethylbutyl) phenol)] (Tinuvin 360 manufactured by BASF) or 2-(4,6-diphenyl-1,3,5-triazin-2-yl)-5-((hexyl)oxy)-phenol (Tinuvin 1577 ED manufactured by BASF). The amount of ultraviolet absorber 39 contained in bonding layer 34 is about at least $5 \times 10^{-5}$ (g/cm$^2$). Bonding layer 34 has an ultraviolet transmittance lower than that of substrate layer 31. Specifically, a transmittance for light having a wavelength of 360 nm in bonding layer 34 may be at least 0.02 times and at most 0.5 times a transmittance for the light having the wavelength of 360 nm in substrate layer 31.

It should be noted that although light reflector 30 includes substrate layer 31, shaping layer 32, and light reflection layer 33 in the present embodiment, light reflector 30 may include bonding layer 34 in addition to substrate layer 31, shaping layer 32, and light reflection layer 33. In other words, light reflector 30 may have a four-layer structure including substrate layer 31, shaping layer 32, light reflection layer 33, and bonding layer 34.

Substrate layer 31 includes, for example, polyethylene terephthalate (PET) or acryl. Moreover, light reflection layer 33 is a metal film including metal such as aluminum or silver, and is an aluminum vapor-deposited film in the present embodiment.

Substrate layer 31 and shaping layer 32 are provided between bonding layer 34 and light reflection layer 33 on the back surface of solar cell 10. In other words, light reflection layer 33 is provided to solar cell 10 via shaping layer 32, substrate layer 31, and bonding layer 34. In the present embodiment, as with light reflection layer 33, substrate layer 31 and shaping layer 32 extend across the space between two adjacent solar cells 10.

Substrate layer 31 is closer to the solar cell 10 side than shaping layer 32 and light reflection layer 33. Accordingly, substrate layer 31 and shaping layer 32 include a light transmissive material such as a transparent material so that light incident from the principal light receiving surface of solar cell module 1 is reflected by a surface of light reflection layer 33 on the principal surface side.

Substrate layer 31 includes, as a specific material, for example, polyethylene terephthalate (PET) or acryl. In the present embodiment, substrate layer 31 is a transparent PET sheet. The material of substrate layer 31 includes resin relatively more sensitive to ultraviolet light than solar cell 10 etc. A refractive index of substrate layer 31 including PET is greater than 1.5.

Shaping layer 32 having an irregular shape is provided on the back surface of substrate layer 31. In shaping layer 32, for example, the height between a recessed portion (bottom) and a protruding portion (peak) is at least 5 μm and at most 100 μm, and the space (intervals) between adjacent protruding portions is at least 20 μm and at most 400 μm. In the present embodiment, the height between a recessed portion and a protruding portion is 12 μm, and the space (intervals) between adjacent protruding portions is 40 μm.

Shaping layer 32 has, as an example, triangular grooves extending along the direction of the long side of light reflector 30. The shape of shaping layer 32 is not limited to this, and may be achieved by cones, quadrangular pyramids, polygonal pyramids, or any combination of these shapes, as long as shaping layer 32 scatters light. It should be noted that shaping layer 32 may include the same material as substrate layer 31.

Light reflection layer 33 is provided on the back surface of shaping layer 32. Light reflection layer 33 is a metal film (a metal reflective film) including metal such as aluminum or silver. Light reflection layer 33 including the metal film is provided on the back surface of shaping layer 32 of substrate layer 31 by, for example, vapor deposition. Accordingly, light reflection layer 33 has a surface shape that conforms to the irregular shape of shaping layer 32. In other words, light reflection layer 33 has a repeating structure of protruding portions and recessed portions. It should be noted that light reflection layer 33 is an aluminum vapor-deposited film in the present embodiment.

Light reflector 30 has a layered structure of substrate layer 31, shaping layer 32, and light reflection layer 33. In other words, shaping layer 32 having the back surface on which light reflection layer 33 is provided is used as light reflector 30. Light reflector 30 has a light reflective function of reflecting incident light.

As shown in FIG. 1 and FIG. 2, light reflectors 30 are provided. Each light reflector 30 is a light reflective sheet having a tape shape that extends along the direction of the long side solar cell string 10S, for example, an elongated rectangular sheet shape. Each light reflector 30 is, for example, 100 mm to 130 mm long, 1 mm to 20 mm wide, and 0.005 mm to 0.5 mm thick. As an example, light reflector 30 is 125 mm long, 5 mm wide, and 0.1 mm thick.

In the present embodiment, light reflector 30 includes light reflection layer 33 having the irregular shape, and thus can diffuse and reflect light incident on light reflector 30 in a predetermined direction. In other words, light reflector 30 is a light diffusive and reflective sheet serving as a light diffusive and reflective component.

In the present embodiment, light reflector 30 is disposed on the back surface side of solar cell 10. When light reflector 30 is disposed on the front surface side of solar cell 10, an effective region (power generation region) of solar cell 10 is likely to be shielded from light incident thereon by light reflector 30 in an overlapping portion of light reflector 30 and solar cell 10. In contrast, disposing light reflector 30 on the back surface side of solar cell 10 reduces such shielding of light.

As shown in FIG. 3 and FIG. 4, light reflector 30 is also disposed so that the back surface of light reflection layer 33 faces back surface protector 50. In other words, light reflector 30 is disposed so that substrate layer 31 is located on the front surface protector 40 side, and light reflection layer 33 is located on the back surface protector 50 side.

Light reflector 30 is sealed by encapsulant 60. Specifically, light reflector 30 is sealed by front surface side encapsulant 61 and back surface side encapsulant 62. More specifically, the front surface protector 40 side (the principal light receiving side) of light reflector 30 is covered with front surface side encapsulant 61, and the back surface protector 50 side of light reflector 30 is covered with back surface side encapsulant 62.

As described above, light reflector 30 (light reflection layer 33) covers the space between two adjacent solar cells 10 (solar cell 10 and another adjacent solar cell 10).

Accordingly, among light incident on solar cell module 1 from the principal light receiving surface side, light incident on the space between two adjacent solar cells 10 passes through front surface protector 40, front surface side encapsulant 61, and bonding layer 34 to light reflector 30, passes through substrate layer 31 and shaping layer 32, and is diffused and reflected (scattered) by light reflection layer 33 having the irregular shape. This diffused and reflected light is reflected by an interface between front surface protector 40 and an air layer or an interface between front surface protector 40 and encapsulant 60, and is guided to solar cells 10. As a result, also light incident on a region in the space between two adjacent solar cells 10, which is a power generation ineffective region (in the present embodiment, a region that is in the space between two adjacent solar cells 10 and in which incident light cannot contribute to power generation), effectively contributes to power generation, and thus the power generation efficiency of solar cell module 1 improves.

In particular, in the present embodiment, light reflector 30 is provided in a power generation ineffective region at an end portion of solar cell 10. Accordingly, productivity improves, and the power generation capacity of solar cell 10 can be efficiently utilized.

[Front Surface Protector, Back Surface Protector]

As shown in FIG. 3, front surface protector 40 is a component that protects the front surface of solar cell module 1, and protects the inside (e.g. solar cell 10) of solar cell module 1 from the external environment, such as rainstorm and an outer shock. Front surface protector is provided on the front surface side of solar cell 10, and protects the light receiving surface on the front surface side of solar cell 10.

Front surface protector 40 includes a light-transmissive component that transmits light in a wavelength band for use in photoelectric conversion in solar cell 10. Front surface protector 40 is, for example, a glass substrate including a transparent glass material, or a resin substrate including a hard resin material having a film-like shape or a plate-like shape and being light transmissive and waterproof.

In contrast, back surface protector 50 is a component that protects the back surface of solar cell module 1, and protects the inside of solar cell module 1 from the external environment. Back surface protector 50 is provided on the back surface side of solar cell 10, and protects the light receiving surface on the back surface side of solar cell 10.

Back surface protector 50 is a film-like or plate-like resin sheet including a resin material such as polyethylene terephthalate (PET) or polyethylene naphthalate (PEN).

Since solar cell module 1 is a monofacial module in the present embodiment, back surface protector 50 may be a non-light-transmissive plate or film. In this case, a non-light-transmissive component (a light-blocking component), for example, a black component or a laminated film such as a resin film containing metal foil such as aluminum foil, may be used as back surface protector 50. It should be noted that back surface protector 50 is not limited to the non-light-transmissive component, and may be a light-transmissive component such as a glass sheet or glass substrate including a glass material.

Encapsulant 60 is filled between front surface protector 40 and back surface protector 50. Front surface protector 40 and back surface protector 50 are bonded and fixed to solar cell 10 by encapsulant 60.

[Encapsulant]

Encapsulant 60 is disposed between front surface protector 40 and back surface protector 50. In the present embodiment, the space between front surface protector 40 and back surface protector 50 is filled with encapsulant 60.

Encapsulant 60 includes front surface side encapsulant 61 and back surface side encapsulant 62. Front surface side encapsulant 61 and back surface side encapsulant 62 cover solar cells 10 arranged in the matrix.

Front surface side encapsulant 61 covers solar cells 10 and light reflection layers 33 from the front surface side of solar cells 10. Specifically, front surface side encapsulant 61 covers all solar cells 10 and all light reflectors 30 from the front surface protector 40 side.

Back surface side encapsulant 62 covers solar cells 10 and light reflection layers 33 from the back surface side of solar cells 10. Specifically, back surface side encapsulant 62 covers all solar cells 10 and all light reflectors 30 from the back surface protector 50 side.

Solar cells 10 are entirely covered with encapsulant 60 by being subjected to lamination (laminated) in a state in which, for example, solar cells 10 are sandwiched between front surface side encapsulant 61 and back surface side encapsulant 62 each having a sheet-like shape.

Specifically, after solar cells 10 are connected by lines 20 to form solar cell strings 10S, solar cell strings 10S are sandwiched by front surface side encapsulant 61 and back surface side encapsulant 62. Further, front surface protector 40 is disposed above front surface side encapsulant 61, and back surface protector 50 is disposed below back surface side encapsulant 62. The resulting structure is subjected to, for example, thermo compression bonding in a vacuum at a temperature of at least 100° C. Front surface side encapsulant 61 and back surface side encapsulant 62 are heated and melted by thermo compression bonding, which results in encapsulant 60 that seals solar cells 10.

Front surface side encapsulant 61 prior to lamination is, for example, a resin sheet including a resin material such as EVA or polyolefin, and is disposed between solar cells 10 and front surface protector 40. Front surface side encapsulant 61 may include the ultraviolet absorber as described above. Mainly a space between solar cells 10 and front surface protector 40 is filled with front surface side encapsulant 61 through lamination.

Front surface side encapsulant 61 includes a light-transmissive material. In the present embodiment, a transparent resin sheet including EVA is used as front surface side encapsulant 61 prior to lamination.

Back surface side encapsulant 62 prior to lamination is, for example, a resin sheet including a resin material such as EVA or polyolefin, and is disposed between solar cells 10 and back surface protector 50. Mainly a space between solar cells 10 and back surface protector 50 is filled with back surface side encapsulant 62 through lamination.

Since solar cell module 1 is a monofacial module in the present embodiment, back surface side encapsulant 62 is not limited to a light-transmissive material, and may include a coloring material such as a black material or a white material. As an example, a white resin sheet including EVA is used as back surface side encapsulant 62 prior to lamination.

Moreover, when front surface side encapsulant 61 includes the ultraviolet absorber, the amount of ultraviolet absorber included in bonding layer 34 may be substantially greater than or equal to the amount of ultraviolet absorber included in front surface side encapsulant 61. Specifically, a transmittance for light having a wavelength of 360 nm in bonding layer 34 including the ultraviolet absorber may be at most 1.2 times a transmittance for the light having the wavelength of 360 nm in front surface side encapsulant 61 including the ultraviolet absorber. The relationship between the transmittance for the light having the wavelength of 360 nm in bonding layer 34 and the transmittance for the light having the wavelength of 360 nm in front surface side encapsulant 61 can be determined according to a transmittance for light in substrate layer 31, a reflectance for light in light reflection layer 33, etc.

[Frame]

As shown in FIG. 1, frame 70 is an outer frame that covers outer edge portions of solar cell module 1. Frame 70 is, for example, an aluminum frame. Frame 70 includes four parts each of which is attached to a corresponding one of the four sides of solar cell module 1. Frame 70 is bonded to, for example, the sides of solar cell module 1 with an adhesive.

It should be noted that, though not shown, solar cell module 1 includes a terminal box for taking out electric power generated by solar cells 10. The terminal box is fixed to, for example, back surface protector 50. The terminal box contains circuit components mounted on a circuit board.

[Manufacturing Method]

Figure 5:
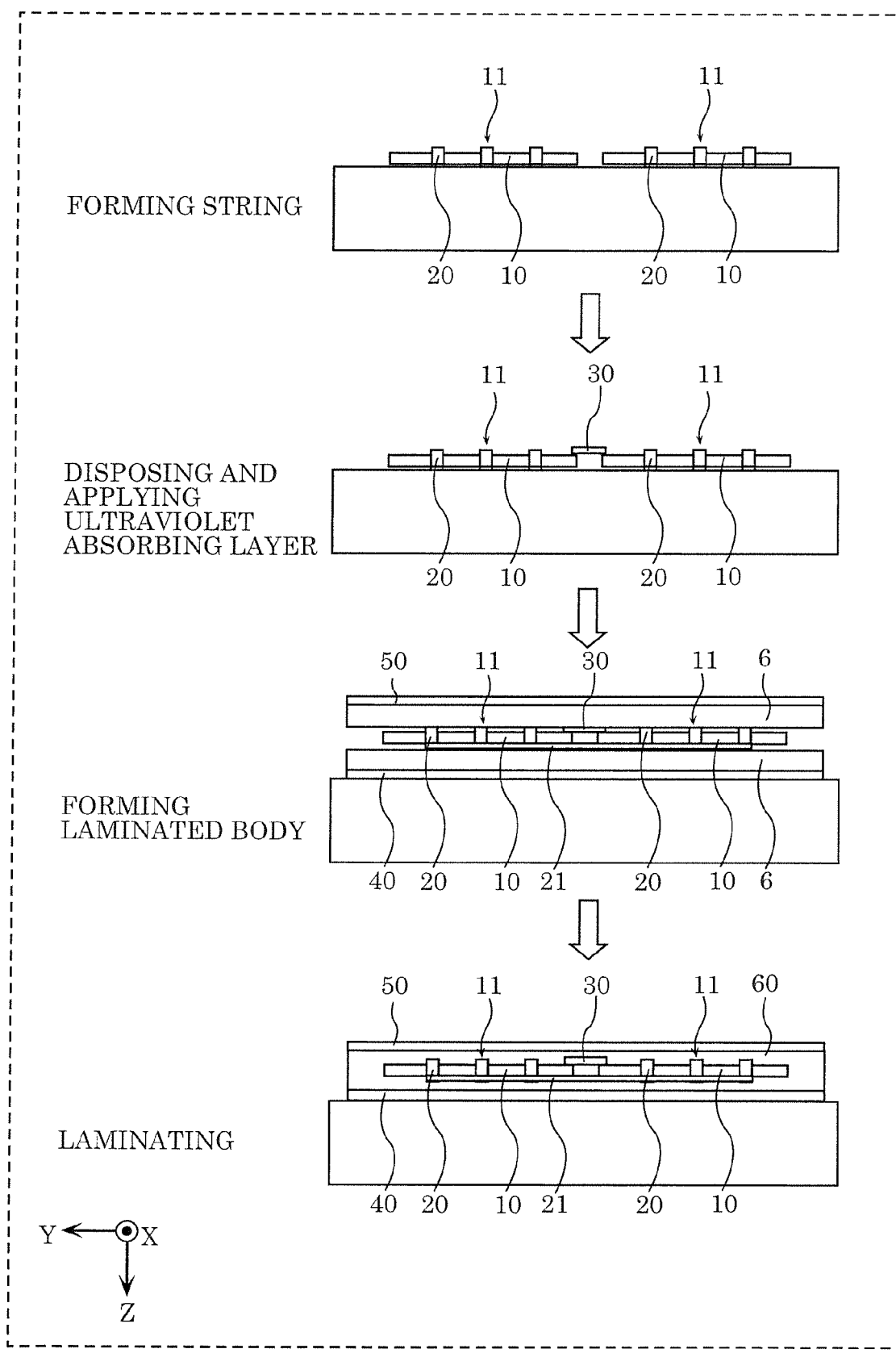
FIG. 5 is a diagram illustrating a method for manufacturing the solar cell module according to the embodiment.

Next, a method for manufacturing solar cell module 1 in the present embodiment will be described with reference to FIG. 5. FIG. 5 is a diagram illustrating the method for manufacturing solar cell module 1 according to the present embodiment.

As shown in FIG. 5, first, line 20 is bonded to solar cell 10 with a conductive adhesive. In this case, the adhesive is disposed on the surface of the bus bar electrodes of front side collector electrode 11 (back side collector electrode 12) of solar cell 10, and line 20 is disposed on the bus bar electrodes. Subsequently, by a pressure bonding device thermo-compression bonding line 20 and solar cell 10, line 20 and solar cell 10 are electrically connected. For example, line 20 and solar cell 10 are bonded by thermo compression bonding (application of heat and pressure) at a predetermined temperature of 200° C. for 10 seconds. In this manner, in the present embodiment, solar cell string 10S in which twelve solar cells 10 are arranged along the row direction is formed (forming a string).

Next, light reflector 30 is prepared that has the light receiving surface to which bonding layer 34 including ultraviolet absorber 39 is applied. Light reflector 30 is disposed in a space between two adjacent solar cell strings 10S (disposing a light reflector, disposing an ultraviolet absorber). At this time, light reflector 30 extends across the space between two adjacent solar cell strings 10S, and has both side end portions protruding toward end portions of solar cells 10 along the Y-axis direction. Then, light reflector 30 disposed in the space between two adjacent solar cells 10 is bonded by thermo compression bonding (bonding).

Next, two adjacent solar cell strings 10S obtained in the bonding are connected to a connection line via line 20. It should be noted that the connection to the connection line may be executed before the bonding, after the bonding, and concurrently with the bonding. Accordingly, solar cell strings 10S are connected in series or parallel to form a cell array.

Next, a laminated body is formed in which front surface protector 40, front surface side resin sheet 6, solar cell strings 10S to which light reflector 30 is bonded, back surface side resin sheet 6, and back surface protector 50 are laminated in stated order (forming a laminated body).

Next, the laminated body formed in the forming of a laminated body is subjected to thermo-compression bonding (laminating). For example, the laminated body is subjected to thermo compression bonding (application of heat and pressure) in a vacuum at a temperature of at least 100° C. Resin sheets 6 are heated and melted by thermo compression bonding, which results in encapsulant 60 that seals solar cells 10. Then, frame 7 is attached to solar cell module 1. Specifically, frame 7 is fixed to outer edge portions of the four sides of solar cell module 1 with an adhesive such as silicon resin. In this way, solar cell module 1 is manufactured.

[Advantageous Effects Etc]

Next, advantageous effects produced by solar cell module 1 in the present embodiment will be described.

As described above, solar cell module 1 according to the present embodiment includes: solar cell 10 having a front surface and a back surface; front surface side encapsulant 61 disposed on a front surface side of solar cell 10, front surface side encapsulant 61 including a transparent resin sheet; light reflector 30 protruding from an end portion of solar cell 10, light reflector 30 including light reflection layer 33 that reflects incident light, and substrate layer 31 that is disposed on light reflection layer 33 on a light incident side; and ultraviolet absorber 39 disposed closer to the light incident side than light reflection layer 33, the light incident side being a back surface side of front surface side encapsulant 61.

Light reflector 30 is exposed to sunlight, and is thus susceptible to damage by ultraviolet rays. For example, bonding layer 34 including ultraviolet absorber 39 is disposed on a solar cell 10 side of light reflection layer 33 so as to absorb ultraviolet rays incident on substrate layer 31 of light reflector 30. Accordingly, ultraviolet absorber 39 absorbs the ultraviolet rays of light passing through front surface protector 40 and front surface side encapsulant 61. For this reason, even when the remaining part of the light from which the ultraviolet rays have been absorbed by ultraviolet absorber 39 is incident on substrate layer 31, the remaining part of the light does not easily damage light reflector 30 compared to light including ultraviolet rays unabsorbed. As a result, yellowing, cracking, etc of substrate layer 31 are reduced.

Accordingly, solar cell module 1 can prevent poor appearance due to the yellowing of substrate layer 31, and reduce the cracking of substrate layer 31 due to aged deterioration.

Moreover, a method for manufacturing solar cell module 1 according to the present embodiment includes: disposing light reflector 30 that protrudes from an end portion of solar cell 10, light reflector 30 including light reflection layer 33 that reflects incident light, and substrate layer 31 that is disposed on light reflection layer 33 on a light incident side; and disposing ultraviolet absorber 39 closer to the light incident side than light reflection layer 33.

This method makes it possible to provide solar cell module 1 that can prevent poor appearance due to the yellowing of substrate layer 31, and reduce the cracking of substrate layer 31 due to aged deterioration.

Moreover, solar cell module 1 according to the present embodiment further includes an ultraviolet absorbing layer (bonding layer 34 in the present embodiment) disposed between front surface side encapsulant 61 and substrate layer 31, the ultraviolet absorbing layer bonding light reflector 30 to the end portion of solar cell 10 and including ultraviolet absorber 39.

With this configuration, bonding layer 34 including ultraviolet absorber 39 is disposed on substrate layer 31 between light reflection layer 33 and solar cell 10, and thus ultraviolet rays included in light passing through front surface protector 40 and front surface side encapsulant 61 are absorbed by ultraviolet absorber 39 of bonding layer 34. Consequently, the ultraviolet rays are not easily incident on substrate layer 31, and the deterioration of substrate layer 31 by the ultraviolet rays is reduced.

Moreover, in solar cell module 1 according to the present embodiment, light reflector 30 is disposed on a back surface side of solar cell 10.

When light reflector 30 is disposed on a front surface side of solar cell 10, solar cell 10 is shielded from light as much as an overlapping portion of solar cell 10 and light reflector 30. With the above configuration, light reflector 30 is disposed on the back surface side of solar cell 10, and thus it is possible to reduce shielding of light occurring on a light receiving surface of solar cell 10.

Moreover, in solar cell module 1 according to the present embodiment, a transmittance for light having a wavelength of 360 nm in bonding layer 34 (the ultraviolet absorbing layer) is at least 0.02 times and at most 0.5 times a transmittance for the light having the wavelength of 360 nm in substrate layer 31.

When an ultraviolet transmittance of ultraviolet absorber 39 exceeds the upper limit thereof, substrate layer 31 below bonding layer 34 (in the Z-axis negative direction) is irradiated with ultraviolet rays, which may deteriorate substrate layer 31. Further, when the ultraviolet transmittance of ultraviolet absorber 39 falls below the lower limit thereof, the adhesiveness between bonding layer 34 and encapsulant 60 decreases, and the transmissiveness of bonding layer 34 decreases, which may reduce a transmittance for visible light.

Moreover, in solar cell module 1 according to the present embodiment, front surface side encapsulant 61 may include the ultraviolet absorber. In this case, a transmittance for light having a wavelength of 360 nm in the ultraviolet absorbing layer (bonding layer 34 in the present embodiment) is at most 1.2 times a transmittance for the light having the wavelength of 360 nm in front surface side encapsulant 61.

With this configuration, the transmittance for the light in bonding layer 34 including ultraviolet absorber 39 is less than the transmittance for the light having the wavelength of 360 nm in front surface side encapsulant 61 including ultraviolet absorber 39, and thus bonding layer 34 more easily absorbs this light than front surface side encapsulant 61. For this reason, the ultraviolet rays are absorbed by the time the light is incident on substrate layer 31, and the light does not easily damage substrate layer 31 compared to a case in which the ultraviolet rays are not absorbed.

Moreover, in solar cell module 1 according to the present embodiment, ultraviolet absorber 39 is a high-molecular-weight ultraviolet absorber having a molecular weight of more than 1000.

With this configuration, in comparison with a case in which an ultraviolet absorbing layer including ultraviolet absorber 39 having a molecular weight of less than 1000 is used, high-molecular-weight ultraviolet absorber 39 included in bonding layer 34 does not easily move into encapsulant 60. Accordingly, in solar cell module 1, the amount (concentration) of ultraviolet absorber 39 included in bonding layer 34, the ultraviolet absorbing layer, is not easily reduced, and thus the aged deterioration of substrate layer 31 can be reduced. Examples of low-molecular-weight ultraviolet absorber 39 include 2,2'-Methylenebis [(6-(2H-benzotriazol-2-yl)-4-(1,1,3,3-tetramethylbutyl) phenol)] (Tinuvin 360 manufactured by BASF) or 2-(4,6-diphenyl-1,3,5-triazin-2-yl)-5-((hexyl)oxy)-phenol (Tinuvin 1577 ED manufactured by BASF). Further, examples of high-molecular-weight ultraviolet absorber 39 having the molecular weight of more than 1000 include UVA-903KT and UVA-935LH manufactured by BASF.

Variation 1 of the Embodiment

Figure 6:
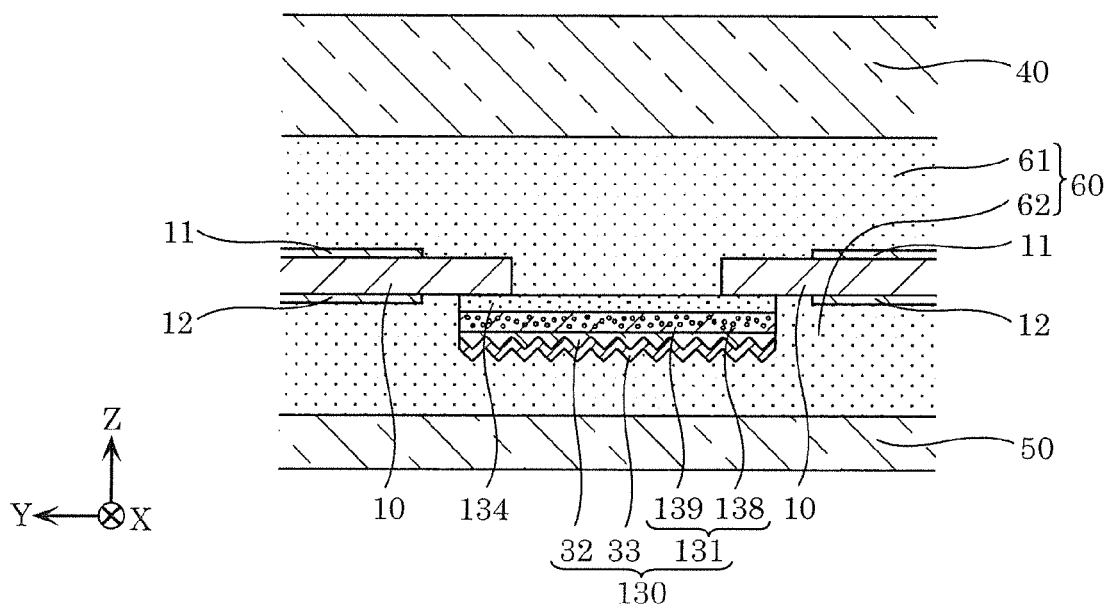
FIG. 6 is a partially enlarged cross-sectional view of a solar cell module according to Variation 1 of the embodiment.

FIG. 6 is a partially enlarged cross-sectional view of solar cell module 1 according to Variation 1 of the embodiment.

As shown in FIG. 6, solar cell module 1 in the present variation differs from solar cell module 1 in the present embodiment in that ultraviolet absorber 138 is provided in substrate layer 131.

In the present variation, substrate layer 131 (an example of the ultraviolet absorbing layer) of light reflector 130 includes base material 139 including, for example, polyethylene terephthalate (PET) or acryl, and ultraviolet absorber 138 included in base material 139. Substrate layer 131 is the ultraviolet absorbing layer including ultraviolet absorber 138. Like in the present embodiment, bonding layer 134 is a heat-sensitive adhesive or pressure-sensitive adhesive including EVA. It should be noted that bonding layer 134 may include ultraviolet absorber 138, and need not include ultraviolet absorber 138.

Accordingly, in solar cell module 1 according to the present variation, substrate layer 131 includes ultraviolet absorber 138.

With this configuration, even when ultraviolet rays included in light passing through front surface protector 40 and front surface side encapsulant 61 is incident on substrate layer 131, ultraviolet absorber 138 included in substrate layer 131 absorbs the ultraviolet rays, and thus it is possible to reduce yellowing and cracking of the base material in substrate layer 131.

Moreover, solar cell module 1 in the present variation of the present embodiment produces the same advantageous effects as the present embodiment.

Figure 7:
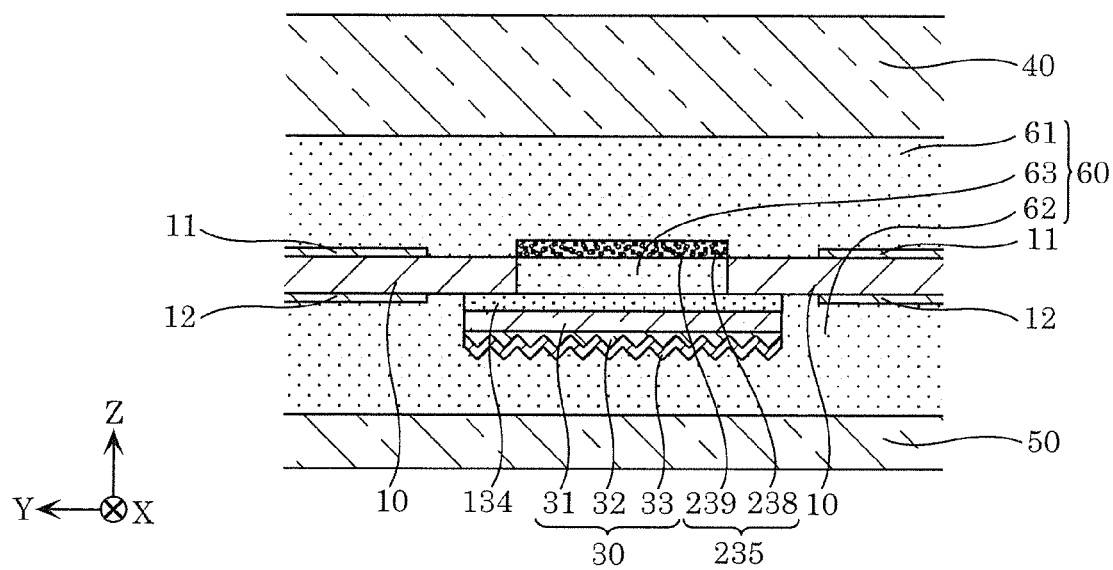
FIG. 7 is a partially enlarged cross-sectional view of a solar cell module according to Variation 2 of the embodiment.

Variation 2 of the Embodiment FIG. 7 is a partially enlarged cross-sectional view of solar cell module 1 according to Variation 2 of the embodiment.

As shown in FIG. 7, solar cell module 1 in the present variation differs from solar cell module 1 in the present embodiment in that ultraviolet absorbing layer 235 including ultraviolet absorber 238 is provided which is different from bonding layer 134 and light reflector 30.

In solar cell module 1 in the present variation, encapsulant 60 includes middle encapsulant 63 provided between light reflector 30 and ultraviolet absorbing layer 235, in addition to front surface side encapsulant 61 and back surface side encapsulant 62. In other words, middle encapsulant 63 fills the space between ultraviolet absorbing layer 235 and light reflector 30.

Ultraviolet absorbing layer 235 is separated from light reflector 30 via middle encapsulant 63. Ultraviolet absorbing layer 235 entirely covers substrate layer 31 of light reflector 30 so as to block sunlight including ultraviolet rays from being incident through the space between two adjacent solar cells 10. In other words, ultraviolet absorbing layer 235 covers the space between two adjacent solar cells 10. The base material of ultraviolet absorbing layer 235 may include a light-transmissive material such as a transparent material, and may be, for example, polyethylene terephthalate (PET) or acryl.

It should be noted that in the present variation, middle encapsulant 63 is provided between ultraviolet absorbing layer 235 and light reflector 30, but ultraviolet absorbing layer 235 may be in contact with the light receiving surface of light reflector 30 without providing middle encapsulant 63. For this reason, middle encapsulant 63 is not an essential structural element.

The following describes differences between a method for manufacturing solar cell module 1 in the present variation and the present embodiment.

In forming a laminated body, a laminated body is formed in which front surface protector 40, front surface side resin sheet 6, solar cell string 10S to which light reflector 30 is bonded, middle resin sheet 6 disposed in the space between adjacent solar cell strings 10S, ultraviolet absorbing layer 235, back surface side resin sheet 6, and back surface protector 50 are laminated in stated order (the forming of a laminated body).

Next, the laminated body formed in the forming of a laminated body is subjected to thermo-compression bonding (laminating). Resin sheets 6 are heated and melted by thermo compression bonding, which results in encapsulant 60 that seals solar cells 10. Specifically, front surface side resin sheet 6, middle resin sheet 6, and back surface side resin sheet 6 become front surface side encapsulant 61, middle encapsulant 63, and back surface side encapsulant 62, respectively. In this way, solar cell module 1 is manufactured.

With this, solar cell module 1 according to the present variation of the present embodiment further includes ultraviolet absorbing layer 235 including ultraviolet absorber 238 that covers the space between two adjacent solar cells 10.

According to this configuration, ultraviolet absorbing layer 235 including ultraviolet absorber 238 covers the space between two adjacent solar cells 10. Accordingly, even in an environment in which substrate layer 31 of light reflector 30 is exposed to sunlight, ultraviolet absorbing layer 235 absorbs ultraviolet rays included in light passing through front surface protector 40 and front surface side encapsulant 61, and the remaining part of the light from which the ultraviolet rays have been absorbed is incident on substrate layer 31 of light reflector 30. As a result, solar cell module 1 blocks ultraviolet rays from being incident on substrate layer 31, thereby reducing, for example, yellowing and cracking of substrate layer 31.

Moreover, solar cell module 1 in the present variation of the present embodiment produces the same advantageous effects as the present embodiment.

Other Variations Etc

Although the solar cell modules according to the present disclosure have been described according to the embodiment and Variations 1 and 2 thereof, the present disclosure is not limited to the embodiment and Variations 1 and 2.

For example, depending on the method for manufacturing the solar cell module in each of the embodiment and variations, there are cases in which the bonding layer, which bonds the light reflector to the back surface of the solar cell, is not required. Accordingly, the bonding layer is not an essential structural element.

Moreover, in each of the embodiment and variations, the ultraviolet absorber may be located in a range from the substrate layer to the light incident surface side, and need not be in contact with the substrate layer. In this regard, however, in consideration of light leaked from the surroundings, the ultraviolet absorber may be disposed as close to the substrate layer as possible, and may be included in the bonding layer.

Moreover, the light reflector does not overlap the back surface side collector electrode of the solar cell in each of the embodiment and variations, but the present disclosure is not limited to this. Specifically, the light reflector may overlap the end portion of the back surface side collector electrode (the end portion of the finger electrode) of the solar cell.

Moreover, the light reflector is disposed in the space between the two adjacent solar cell strings in each of the embodiment and variations, but the present disclosure is not limited to this. For example, a light reflector may be disposed in a space between adjacent solar cells in a solar sell string. This light reflector has the same configuration as the light reflector described in each of the embodiment and variations, and can be bonded to a solar cell in the same disposition and shape as those of the light reflector.

Moreover, the light reflector is disposed in each space between the two adjacent solar cells in the space between the two adjacent solar cell strings in each of the embodiment and variations, but the present disclosure is not limited to this. For example, in the space between the two adjacent solar cell strings, the light reflector may extend over the solar cells along the direction of the long side of the solar cell strings. As an example, the light reflector may be a single elongated light reflective sheet extending over an entire solar cell string.

Moreover, the light reflector is disposed in each of the spaces between all of the solar cell strings in each of the embodiment and variations, but the light reflector may be disposed in only some of the spaces. In other words, the spaces may include a space in which the light reflector is not disposed.

Moreover, the semiconductor substrate of the solar cell is the n-type semiconductor substrate in each of the embodiment and variations, but the semiconductor substrate may be a p-type semiconductor substrate.

Moreover, the semiconductor material of the photoelectric converter of the solar cell is silicon in each of the embodiment and variations, the present disclosure is not limited to this. Examples of the semiconductor material of the photoelectric converter of the solar cell may include gallium arsenide (GaAs) or indium phosphide (InP).

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module, comprising:
   a solar cell having a front surface and a back surface;
   a front surface side encapsulant disposed on a front surface side of the solar cell, the front surface side encapsulant including a transparent resin sheet;
   a light reflector protruding from an end portion of the solar cell, the light reflector including a light reflection layer that reflects incident light, and a substrate layer that is disposed on the light reflection layer on a light incident side, the light incident side being a back surface side of the front surface side encapsulant;
   a first ultraviolet absorber disposed closer to the light incident side than the light reflection layer; and
   a first ultraviolet absorbing layer disposed between the front surface side encapsulant and the substrate layer
   wherein:
   the first ultraviolet absorbing layer bonds the light reflector to the end portion of the solar cell and includes the first ultraviolet absorber, and
   a transmittance for light having a wavelength of 360 nm in the first ultraviolet absorbing layer is at least 0.02 times and at most 0.5 times a transmittance for the light having the wavelength of 360 nm in the substrate layer.

2. The solar cell module according to claim 1,
   wherein the substrate layer includes a second ultraviolet absorber.

3. The solar cell module according to claim 1, further comprising:
   a plurality of solar cells; and
   a second ultraviolet absorbing layer covering a space between two adjacent solar cells, the second ultraviolet absorbing layer including a second ultraviolet absorber.

4. The solar cell module according to claim 1,
   wherein the light reflector is disposed on a back surface side of the solar cell.

5. A solar cell module, comprising:
   a solar cell having a front surface and a back surface;
   a front surface side encapsulant disposed on a front surface side of the solar cell, the front surface side encapsulant including a transparent resin sheet;
   a light reflector protruding from an end portion of the solar cell, the light reflector including a light reflection layer that reflects incident light, and a substrate layer that is disposed on the light reflection layer on a light incident side, the light incident side being a back surface side of the front surface side encapsulant;

a first ultraviolet absorber disposed closer to the light incident side than the light reflection layer; and a first ultraviolet absorbing layer disposed between the front surface side encapsulant and the substrate layer wherein:

the first ultraviolet absorbing layer bonds the light reflector to the end portion of the solar cell, the front surface side encapsulant includes the first ultraviolet absorber, and a transmittance for light having a wavelength of 360 nm in the first ultraviolet absorbing layer is at most 1.2 times a transmittance for the light having the wavelength of 360 nm in the front surface side encapsulant.

6. The solar cell module according to claim 1, wherein the first ultraviolet absorber is a high-molecular-weight ultraviolet absorber having a molecular weight of more than 1000.

7. The solar cell module according to claim 5, wherein the substrate layer includes a second ultraviolet absorber.

8. The solar cell module according to claim 5, further comprising:

a plurality of solar cells; and a second ultraviolet absorbing layer covering a space between two adjacent solar cells, the second ultraviolet absorbing layer including a second ultraviolet absorber.

9. The solar cell module according to claim 5, wherein the light reflector is disposed on a back surface side of the solar cell.

10. The solar cell module according to claim 5, wherein the first ultraviolet absorber is a high-molecular-weight ultraviolet absorber having a molecular weight of more than 1000.

11. The solar cell module according to claim 2, wherein the second ultraviolet absorber is a high-molecular-weight ultraviolet absorber having a molecular weight of more than 1000.

12. The solar cell module according to claim 3, wherein the second ultraviolet absorber is a high-molecular-weight ultraviolet absorber having a molecular weight of more than 1000.

13. The solar cell module according to claim 7, wherein the second ultraviolet absorber is a high-molecular-weight ultraviolet absorber having a molecular weight of more than 1000.

14. The solar cell module according to claim 8, wherein the second ultraviolet absorber is a high-molecular-weight ultraviolet absorber having a molecular weight of more than 1000.

* * * * *